(12) United States Patent
Choudhury et al.

(10) Patent No.: US 8,218,323 B2
(45) Date of Patent: *Jul. 10, 2012

(54) APPARATUS AND METHOD FOR EMBEDDING COMPONENTS IN SMALL-FORM-FACTOR, SYSTEM-ON-PACKAGES

(75) Inventors: Debabani Choudhury, Thousand Oaks, CA (US); Prasad Alluri, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 230 days.

This patent is subject to a terminal disclaimer.

(21) Appl. No.: 12/642,423

(22) Filed: Dec. 18, 2009

(65) Prior Publication Data
US 2011/0148545 A1    Jun. 23, 2011

(51) Int. Cl.
| | |
|---|---|
| H05K 7/20 | (2006.01) |
| H05K 1/03 | (2006.01) |
| H05K 1/18 | (2006.01) |
| H05K 9/00 | (2006.01) |

(52) U.S. Cl. ........ 361/719; 361/704; 361/761; 361/762; 361/764; 361/816; 361/818; 174/250; 174/252; 174/255; 174/260; 257/706; 257/713; 333/185

(58) Field of Classification Search .................. 174/252, 174/260, 250; 257/686, 712–713, 706; 333/185; 361/704, 707, 717–718, 719
See application file for complete search history.

(56) References Cited

U.S. PATENT DOCUMENTS
7,852,281 B2 * 12/2010 Choudhury .................. 343/851

OTHER PUBLICATIONS

Vyas et al., "Liquid Crystal Polymer (LCP): The Ultimate Solution for Low-Cost RF Flexible Electronics and Antennas", Antennas and Propagation Society International Symposium, IEEE, 2007, pp. 1729-1730.*

* cited by examiner

Primary Examiner — Robert J Hoffberg
(74) Attorney, Agent, or Firm — Pillsbury Winthrop Shaw Pittman LLP

(57) ABSTRACT

According to various aspects of the present disclosure, an apparatus is disclosed that includes a small form factor mobile platform including a system-on-package architecture, the system-on-package architecture arranged as a stack of layers including a first layer having a first conformable material; a second layer having a second conformable material; one or more electronic components embedded within the stack of layers; and a heat dissipating element configured dissipating heat generating from the one or more electronic components, wherein the first conformable material, the second conformable material, or both are configured to allow high frequency signal routing.

24 Claims, 4 Drawing Sheets

EXAMPLE VERTICAL ISOLATION STRUCTURES A AND B

EXAMPLE HORIZONTAL ISOLATION STRUCTURES - C

APPARATUS AND METHOD FOR EMBEDDING COMPONENTS IN SMALL-FORM-FACTOR, SYSTEM-ON-PACKAGES

BACKGROUND

1. Field of the Invention

The present invention relates generally to integrated circuit design, and more particularly, to a small-form-factor (SFF), system-on-package (SOP) architecture having one or more of improved performance, integrated thermal management and interference mitigation within the SFF-SOP environment.

2. Description of the Related Art

Mobile platforms are getting smaller in size and incorporating more electronic and wireless functionalities for efficient communications. In order to include all the desired electronic functionalities into the future small-form-factor (SFF) mobile platforms, embedded system-on-package (SOP) architectures are being developed.

Currently different active component as well as passive component embedding techniques are being developed using multilayer substrate materials and cavities. Device embedding techniques are being developed using low-cost materials which are not good for embedding radio-frequency (RF) functionalities. Some approaches to embed 'integrated-passive-devices' are being developed which may increase the cost of manufacturing and assembly, which tends to minimize the purpose of using low-cost material system. Moreover, RF-performance and size-reduction remains difficult to achieve for multi-standard wireless systems. RF-IPDs (Integrated Passive Devices) are also being utilized on silicon, low temperature co-fired ceramic (LTCC), glass or other materials and embedded into the low-cost material systems for RF connections. This potentially increases the cost of assembly and manufacturing considerably and degrade/changes the performance of complex passive structures after other component embedding or shielding in close proximity.

On the other hand, high-performance materials are being utilized which are perceived to have higher cost than digital-substrate materials. These materials can embed complex RF passive designs in multilayer material environment. Thermal and noise management issues are not yet solved in the current SOP structures. The conventional electromagnetic band-gap (EBG) structures for noise-mitigation in the SFF-SOP environment will tend to consume significant space and will increase the overall SOP size. Both of these approaches also suffer from cross-talk thermal issues.

BRIEF DESCRIPTION OF THE DRAWINGS

FIG. 3b shows vertical periodic micro-via structures A and B, taken along the lines A and B of FIG. 3a.

FIG. 3c shows horizontal periodic structures, taken along the line C of FIG. 3a.

DETAILED DESCRIPTION

Definitions

Figure 1:
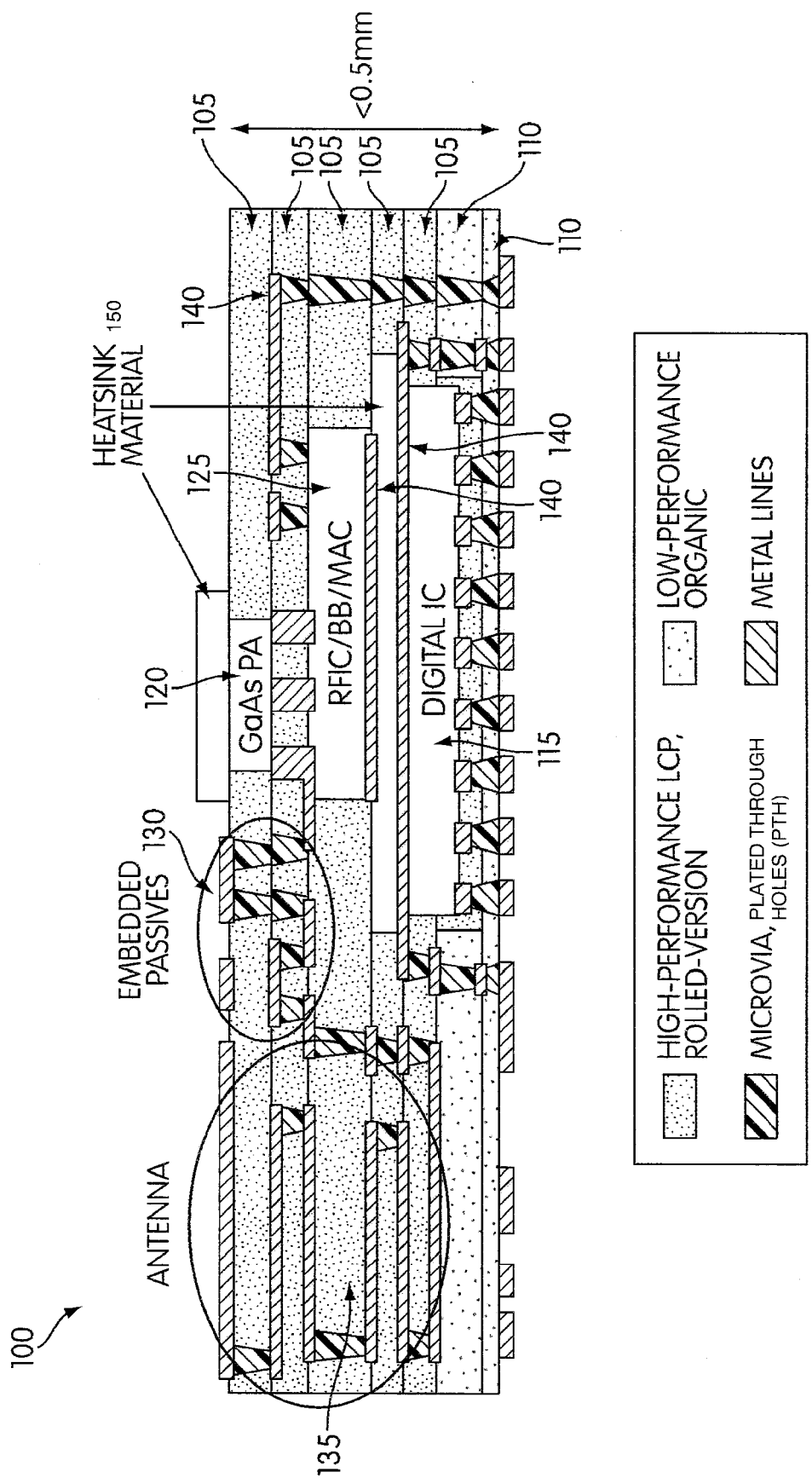
FIG. 1 shows a cross-section of a SOP with both high-performance and low-performance polymer layers to form a stack of materials in accordance with various embodiments of the present invention.

High-performance material: High-performance material is a material that provides superior electrical properties including low loss and low coefficient of thermal expansion (CTE) characteristics versus the properties of a low-performance material.

In accordance with various aspects of the present disclosure, an apparatus is disclosed that includes a small form factor mobile platform including a system-on-package architecture, the system-on-package architecture arranged as a stack of layers including a first layer having a first conformable material; a second layer having a second conformable material or any other rigid organic material; and one or more electronic components embedded within the stack of layers; a heat dissipating element configured dissipating heat generating from one or more electronic components, wherein the first conformable material, the second conformable material, or both are configured to allow high frequency signal routing.

In accordance with various aspects of the present disclosure, the heat dissipating element can be arranged between the first and the second layers. The heat dissipating element can include a high-conductivity material, such as metal, or a directional conductor. The high-conductivity metal can be selected from the group consisting of copper, aluminum, KOVAR, which is a heatsink material, bronze, silicon-carbide or other materials such as gold or silver and the directional conductor can include graphite that is configured to dissipate heat along a two-dimensional plane. Moreover, the apparatus can include features wherein the first conformable material and the second conformable material are the same material or are different materials. Further, the apparatus can include features wherein the first conformable material, the second conformable material, or both include a polymer, such as a liquid crystal polymer or can be a rigid organic or polymer material. Further, the apparatus can further include a third layer having a third material.

In accordance with various aspects of the present disclosure, the apparatus can further include a vertical filtering structure arranged between the one or more electronic components. The vertical filtering structure can include stacked via patterns, arranged in a periodic arrangement of the vertical filtering structure that can define a filtering characteristic. The apparatus can include features wherein the vertical filtering structure is configured to filter or isolate radio-frequency noise, harmonics of digital noise, or both produced by the one or more electronic components. Moreover, the apparatus can include features wherein the third material is different than the first and the second conformable materials.

In accordance with various aspects of the present disclosure, a method is disclosed that includes forming a small form factor mobile platform including a system-on-package architecture, the system-on-package architecture arranged as a stack of layers including providing a first layer of a first conformable material; providing a second layer of a second conformable material; embedding one or more electronic components within the stack of layers; arranging a heat dissipating element in the stack of layers to dissipate heat generated from the one or more electronic components, wherein the first conformable material, the second conformable material, or both are configured to allow high frequency signal routing.

In accordance with various aspects of the present disclosure, the heat dissipating element can be arranged between the first and the second layers. The first conformable material and the second conformable material can be the same material or different materials. For example, the first or second conformable material, or both can include a polymer, such as a liquid crystal polymer or can be a rigid organic or polymer material. The heat dissipating element can include a high-conductivity material, such as metal, or a directional conductor, wherein the high-conductivity metal can be selected from the group consisting of copper and aluminum and the directional conductor can include graphite that is configured to dissipate heat along a two-dimensional plane. Further, the apparatus can further include a third layer having a third material.

In accordance with various aspects of the present disclosure, the method can include arranging a vertical filtering structure between the one or more electronic components, wherein the vertical periodic filtering structure includes stacked via patterns. The arrangement of the vertical filtering structure can be periodic and define a filtering characteristic, wherein the vertical filtering structure is configured to filter or isolate radio-frequency noise, harmonics of digital noise, or both produced by the one or more electronic components. The vertical filtering can be combined with the horizontal periodic filtering as allowed by the small-form-factor SOP in consideration.

These and other objects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various FIGS. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

FIG. 1 shows a cross-section of a SOP with both high-performance and low-performance polymer layers to form a stack of materials in accordance with various aspects of the present disclosure. The heterogeneous stackup, shown generally at 100, includes one or more layers of high-performance material 105, and one or more layers of low-performance material 110. By way of a non-limiting example, the high-performance material 105 may be a polymer, such as a liquid crystal polymer (LCP), Rogers RXP or any other material that exhibits superior electrical properties compared to those of low-performance material 110 over a wide frequency range. Low loss tangent is a factor for the high-performance material 105 and is directly related to circuit signal losses and quality or Q factor. Because of these characteristics, the high performance materials, such as LCP, allow for high frequency signal routing and passives. The low-performance material 110 may include a polymer, such as ABF (Ajinomoto Build-up Film), FR4, BT or any other organic materials.

The high-performance materials 105, like LCP, may be more flexible or pliable than the low-performance material 110. This flexibility of the high-performance material 105 allows these layers to conform around electrical components, such that the electrical components may be embedded between layers of the high-performance material. In some aspects, a particular layer of the stackup may include both the high-105 and low-performance material 110. In this case, the electrical and/or the RF component may be arranged within layers of a high-performance material and adjacent to low-performance materials on a particular layer of the SOP.

By way of a non-limiting example, the stackup as shown in FIG. 1 can be less than 0.5 mm thick. The vertical dimension of the SOP may be reduced by thinning the substrates. In this case, the embedded IC designs, if necessary, may be optimized to include the effect of thin substrates as well as polymer material environments.

In some aspects, the stackup can be a homogeneous stackup include only one type of layers. For example, stackup can include layers of the high-performance material or layers of low-performance material.

The stackup may include different active ICs components 115, including different electrical and/or radio-frequency components, that may be arranged between layers of high-performance material 105. By way of a non-limiting example, the different electrical ICs may include a power amplifier (PA) 120 such as GaAs PA. Moreover, the different radio frequency ICs may include a combination chipset of two highly integrated ICs such as RFIC and BB/MAC IC 125, which may operate under the IEEE 802.11n and IEEE 802.11a/b/g standards. Other chipset operating under different wireless standards may also be used. These ICs are not limited to those used in wireless application, but can include ICs such as memory, general purpose processors, or application specific ICs and System-on-Chip (SOC). The stackup may also contain one or more passive components 130 that may be either a radio-frequency (RF) component that consume (but does not produce) energy, or a component that is incapable of a power gain. Examples of RF passive components may include capacitors, inductors, resistors, transformers, high-rejection multiband RF filters, multiplexers and baluns. Other passive components, such as an antenna 135, can be embedded within layers of the multilayer metals to achieve higher RF-performance. RF-signals from the silicon-integrated single chip such as RFIC 125 may be routed using the layers of high-performance materials 105 whereas digital signals may be routed using the layers of low-performance materials 110 through metal lines 140.

In various aspects of the present disclosure, a rolled version of high-performance liquid crystal polymer (LCP) materials may be used for embedding RF-actives and develop embedded RF-passives using the LCP-multi-metal-substrate layer structures. The rolled versions of LCP are typically less expensive than the original LCP materials. This allows the SOP form-factor (all x-, y-, z-directions) to be minimized by designing the optimized high-performance passive components in the LCP-type layers around the embedded active components. The LCP-type materials will allow the substrate materials to conform around the embedded active components and reduce the need for any surface protection around the embedded active components. Thin layers of LCP ($\leq 25$ μm thick) type materials may be used as re-distribution layers for efficient RF-, analog- and digital-signal distribution to achieve small-form-factor. Lower-cost ABF-type materials may be used in the stackup to embed additional digital functionalities.

In accordance with various aspects of the present disclosure, the SOP as shown at 100 may be modified by including one or more heat dissipating elements. The one or more heat dissipating elements may be arranged within a homogenous stack of materials, such as a stack of materials having only high-performance material or only low-performance material. The one or more heat dissipating elements may also be arranged within a heterogeneous stack of materials, such as a stack having both high- and low-performance material. As shown in FIG. 1, the one or more heat dissipating elements, such as heatsink materials 150, can be arranged near the high-power active components to dissipate the heat generated by the active component. In a non-limiting example, the heat dissipating elements are in a layer above, or directly on top of, the active component. The heat dissipating element may be arranged between layers of the high-performance material or between layers of the high- and low-performance material. The heat dissipating elements may be a high-conductivity material, such as metal, and can include copper, aluminum, KOVAR (KOVAR is a trademark of Carpenter Technology Corporation and is a nickel-cobalt ferrous alloy designed to be compatible with the thermal expansion characteristics of borosilicate glass in order to allow direct mechanical connections over a range of temperature) and silicon carbide (SiC), or a directional conductor such as graphite, which dissipates heat in a two-dimensional (x-, y-) plane. Combination of different heat dissipaters and stacked via patterns, discussed further below, can be utilized for realizing optimal heat sinking structures. By this arrangement of the one or more heat dissipating elements within the small-form-factor SOP, the need for an external heat sink may be reduced or eliminated.

In accordance with various aspects of the present disclosure, thin sheets of thermal materials may be embedded in the LCP type materials due to the conformable properties of high-performance LCP. The thin sheets of copper, graphite, KOVAR, silicon-carbide, brass and other materials with good thermal properties may be embedded under ICs with high-power dissipation (such as PA) to enable thermal management within the SOP architectures and still maintain SFF properties. The LCPs can be set around the materials to conform and create SOPs without any voids or gaps. Graphite materials disperse heat in the X-Y direction and may be embedded in certain cases to spread the heat to thermal dissipators/metal-vias, discussed further below, to take the heat out from the embedded SOP structure.

Figure 2:
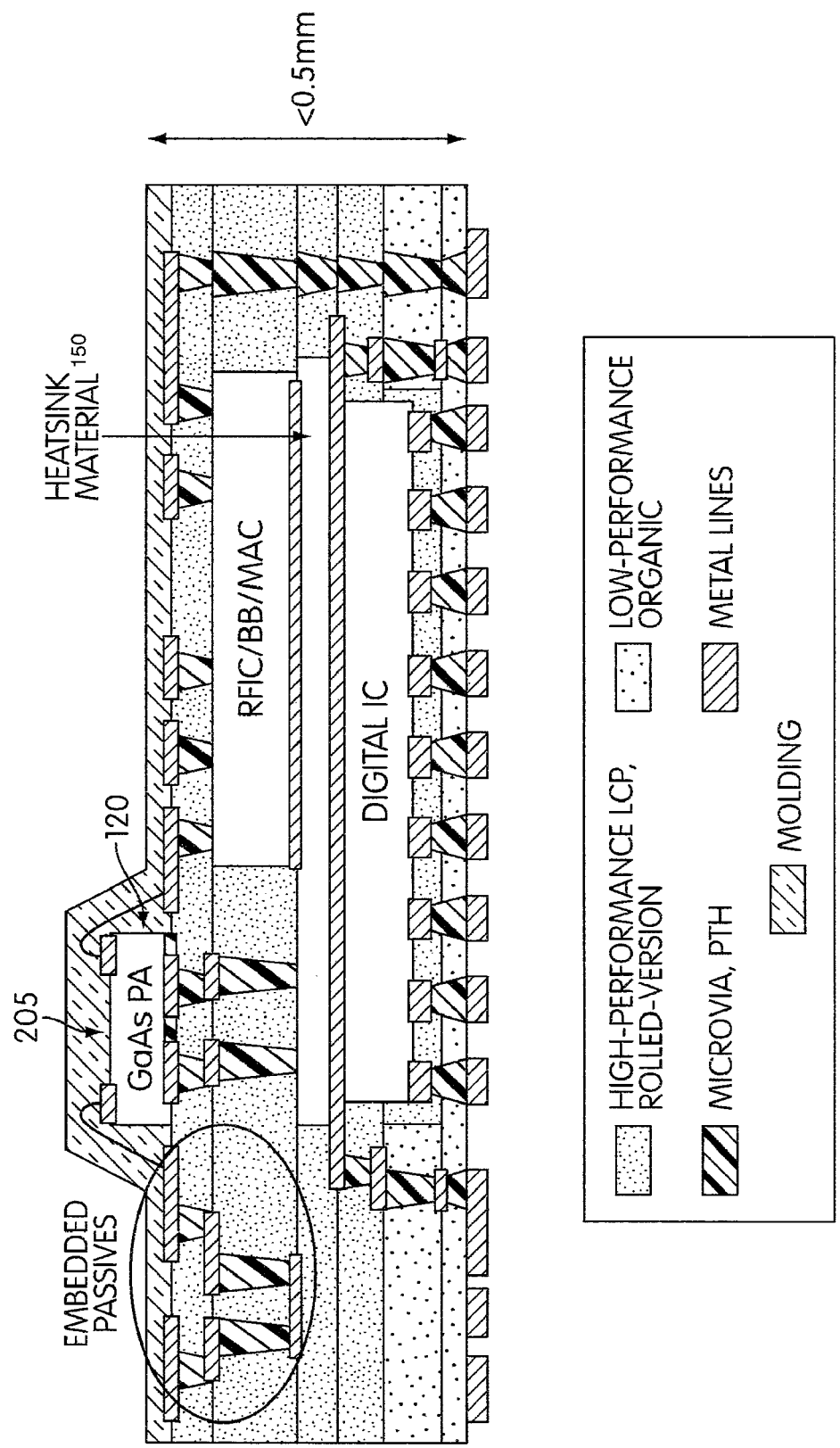
FIG. 2 shows another cross-section of a SOP with both high-performance and low-performance polymer layers to form a stack of materials in accordance with various aspects of the present disclosure.

FIG. 2 shows another cross-section of a SOP with both high-performance and low-performance polymer layers to form a stack of materials in accordance with various aspects of the present disclosure. FIG. 2 is similar to FIG. 1, but shows power amplifier 120, GaAs PA, mounted on top of the substrate. For small IC components such as GaAs PA, they need not be embedded since they do not occupy a large area on the substrate. A molding layer 205 may be arranged over the top-mounted component to encapsulate and protect the SOP.

Figure 3A:
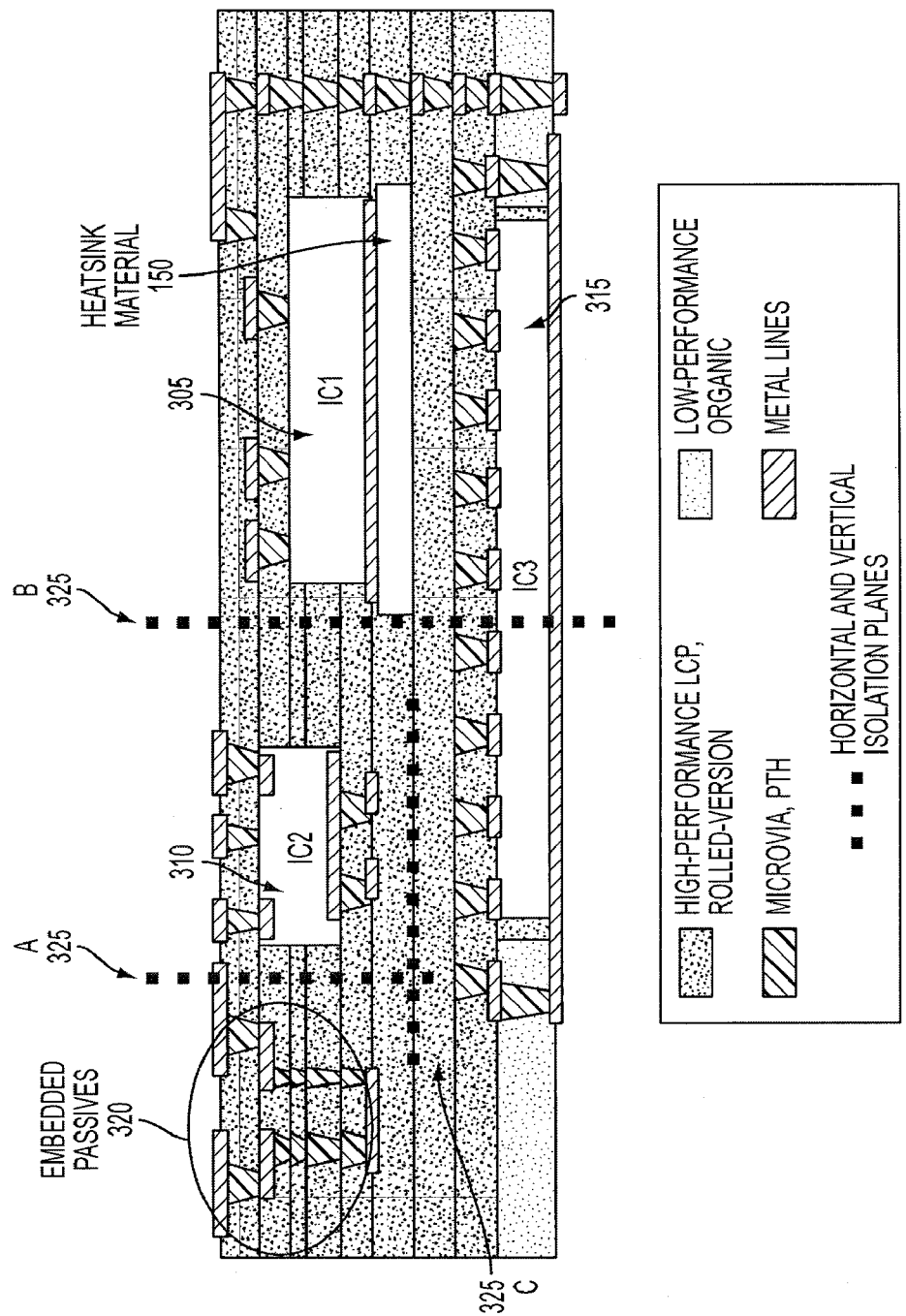
FIG. 3a shows a cross-section of a SOP, which includes embedded isolation structures in accordance with various aspects of the present disclosure.

FIG. 3a shows a cross-section of a SOP, which includes embedded isolation structures in accordance with various aspects of the present disclosure. The embedded isolation structures are configured and arranged to reduce noise coupling and crosstalk issues in a very small form factor SOP. Similar to the heat dissipating structure described above, the isolation structure may be arranged within a homogenous stack of materials, such as a stack of materials having only high-performance material or only low-performance material. Also, the isolation structures may also be arranged within a heterogeneous stack of materials, such as a stack having both high- and low-performance material. ICs are shown in FIG. 3a, IC1 (305), IC2 (310) and IC3 (315), arranged among the high-performance materials of the SOP. Also, one or more passive components 320 are shown embedded within layers of the high-performance material. Isolation structures 325 may be embedded within the SOP to reduce noise coupling and crosstalk issues in the SOP.

Figure 3B:
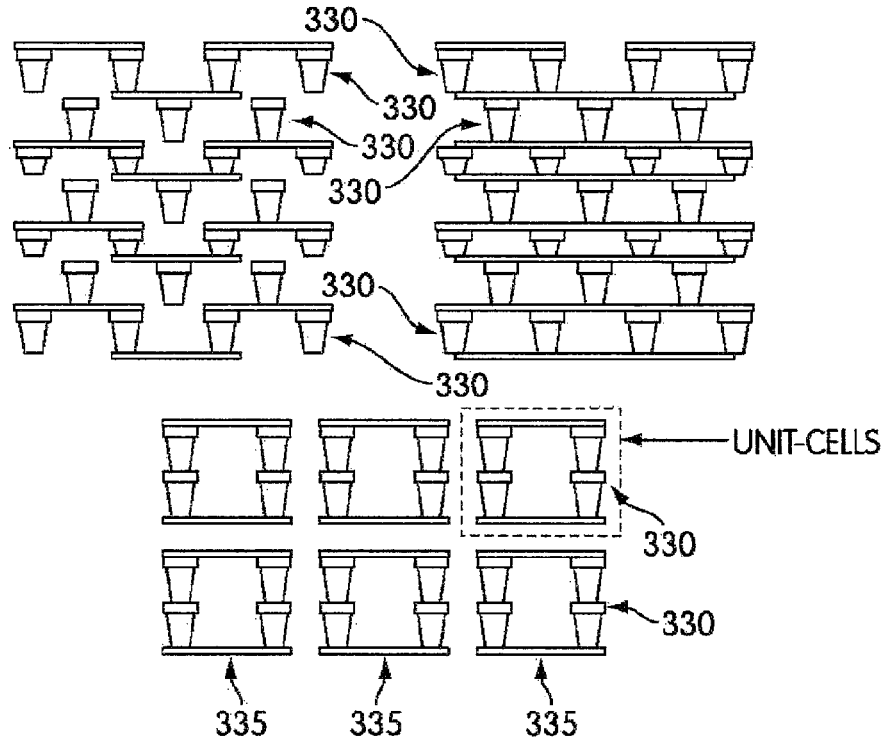
Figure 3C:
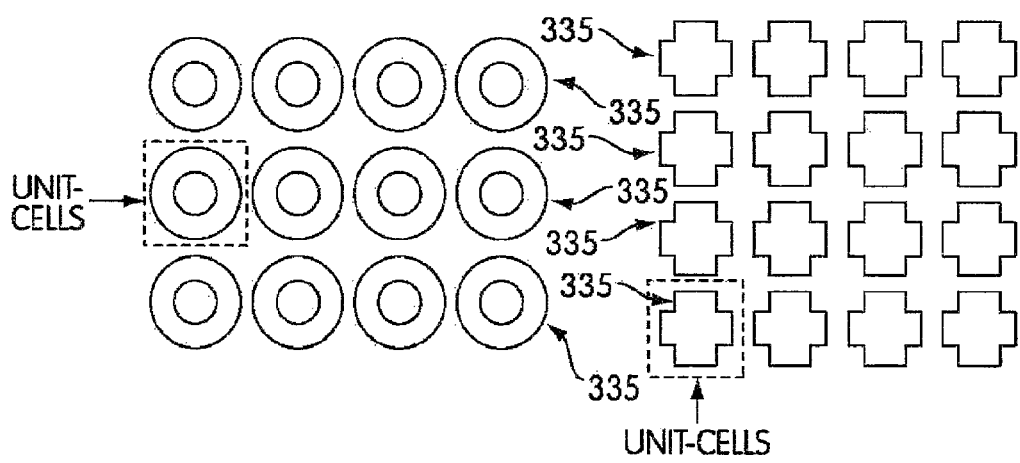

FIG. 3b shows vertical periodic micro-via structures A and B, taken along the lines A and B of FIG. 3a. The vertical micro-via structures 330 are configured and arranged to reduce element-to-element noise-coupling/crosstalk. The characteristic of the crosstalk isolation can be tuned by changing the periodicity of the vertical structures. FIG. 3c shows horizontal periodic isolation structures 335, taken along the line C of FIG. 3a. Both the vertical and horizontal structures may be combined to create improved isolation in the complete SOP environment. These isolation structures may be used to surround the radio or digital functional blocks in order to isolate the RF noise as well as harmonics of digital noise.

In some aspects of the present disclosure, faraday cages and horizontal electronic bandgap (EBG) structures using patterned metals may be used for the isolation structures. Moreover, the vertical periodic structures may also be combined with the horizontal EBG metal patterns to form effective noise reducers around desired parts of the SOP.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. An apparatus comprising:
 a mobile platform including a system-on-package architecture, the system-on-package architecture arranged as a stack of layers including:
 a first layer of the stack of layers having a first conformable material;
 a second layer of the stack of layers having a second conformable material;
 one or more electronic components embedded within the stack of layers; and
 a heat dissipating element arranged between the first layer and the second layer, the heat dissipating element substantially covering a surface area of at least one of the one or more electronic components, wherein the heat dissipating element is configured to dissipate heat generating from the at least one of the one or more electronic components,
 wherein the first conformable material, the second conformable material, or both are configured to allow routing of radio frequency signals.

2. The apparatus according to claim 1, wherein the heat dissipating element includes a conductive material or a directional conductor.

3. The apparatus according to claim 2, wherein the conductive material is selected from the group consisting of: copper, aluminum, brass, silicon-carbide (SiC) or KOVAR.

4. The apparatus according to claim 2, wherein the directional conductor includes graphite that is configured to dissipate heat along a two-dimensional plane.

5. The apparatus according to claim 1, wherein the first conformable material and the second conformable material are the same material.

6. The apparatus according to claim 1, wherein the first conformable material and the second conformable material are different materials.

7. The apparatus according to claim 1, wherein the first conformable material, the second conformable material, or both include a polymer.

8. The apparatus according to claim 1, wherein the stack of layers further includes:

a third layer of the stack of layers having a third material that is different than the first and the second conformable materials.

9. The apparatus according to claim 1, further comprising:
a periodic isolation structure arranged within the stack of layers and configured to reduce noise generated by any of the one or more electronic components, crosstalk between at least two of the one or more electronic components, or both, wherein the periodic isolation structure includes a plurality of elements arranged in a periodic configuration.

10. The apparatus according to claim 9, wherein the periodic isolation structure includes stacked via patterns.

11. The apparatus according to claim 9, wherein an operational characteristic of the periodic isolation structure is adaptable based on a period of the periodic configuration of the plurality of elements.

12. The apparatus according to claim 9, wherein the noise includes radio-frequency noise, harmonics of digital noise, or both produced by the one or more electronic components.

13. A method comprising:
forming a mobile platform including a system-on-package architecture, the system-on-package architecture arranged as a stack of layers including:
providing a first layer of the stack of layers having a first conformable material;
providing a second layer of the stack of layers having a second conformable material;
embedding one or more electronic components within the stack of layers; and
arranging a heat dissipating element between the first layer and the second layer, the heat dissipating element substantially covering a surface area of at least one of the one or more electronic components, wherein the heat dissipating element is configured to dissipate heat generated from the at least one of the one or more electronic components;
wherein the first conformable material, the second conformable material, or both are configured to allow routing of radio frequency signals.

14. The method according to claim 13, wherein the heat dissipating element includes a conductive material or a directional conductor.

15. The method according to claim 14, wherein the conductive material is selected from the group consisting of: copper, aluminum, brass, silicon-carbide (SiC) or KOVAR.

16. The method according to claim 14, wherein the directional conductor includes graphite that is configured to dissipate heat along a two-dimensional plane.

17. The method according to claim 13, wherein the first conformable material and the second conformable material are the same material.

18. The method according to claim 13, wherein the first conformable material and the second conformable material are different materials.

19. The method according to claim 13, wherein the first conformable material, the second conformable material, or both include a polymer.

20. The method according to claim 13, further comprising:
arranging a third layer of the stack of layers having a third material that is different than the first and the second conformable materials.

21. The method according to claim 13, further comprising:
arranging a periodic isolation structure within the stack of layers, wherein the periodic isolation structure a plurality of elements arranged in a periodic configuration and is configured to reduce noise generated by any of the one or more electronic components, crosstalk between at least two of the one or more electronic components, or both.

22. The method according to claim 21, wherein the periodic isolation structure includes stacked via patterns.

23. The method according to claim 21, wherein an operational characteristic of the periodic isolation structure is adaptable based on a period of the periodic configuration of the plurality of elements.

24. The method according to claim 21, wherein noise includes radio-frequency noise, harmonics of digital noise, or both produced by the one or more electronic components.

* * * * *